US007282906B2

United States Patent
Coffy

(10) Patent No.: US 7,282,906 B2
(45) Date of Patent: Oct. 16, 2007

(54) ELECTRONIC CIRCUIT PROTECTION DEVICE

(75) Inventor: Romain Coffy, La Tronche (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/407,855

(22) Filed: Apr. 20, 2006

(65) Prior Publication Data

US 2006/0273813 A1  Dec. 7, 2006

(30) Foreign Application Priority Data

Apr. 21, 2005  (FR) .................................. 05 51019

(51) Int. Cl.
*H01L 23/552* (2006.01)
*H01K 7/14* (2006.01)

(52) U.S. Cl. .................. 324/158.1; 257/659; 257/660; 361/800

(58) Field of Classification Search ..................... None
See application file for complete search history.

(56) References Cited

U.S. PATENT DOCUMENTS

| 3,754,170 | A | * | 8/1973 | Tsuda et al. ................. 257/659 |
| 5,151,770 | A | * | 9/1992 | Inoue .......................... 257/660 |
| 5,256,590 | A | * | 10/1993 | Inoue .......................... 438/454 |
| 5,740,527 | A |   | 4/1998 | Mitama ....................... 455/301 |
| 5,831,324 | A | * | 11/1998 | Bang ........................... 257/508 |
| 5,939,784 | A |   | 8/1999 | Glenn ......................... 257/710 |
| 6,137,693 | A |   | 10/2000 | Schwiebert et al. ........ 361/803 |
| 6,472,723 | B1 | * | 10/2002 | Jarstad et al. ............... 257/659 |
| 6,686,649 | B1 |   | 2/2004 | Mathews et al. ........... 257/659 |

* cited by examiner

*Primary Examiner*—Paresh Patel
(74) *Attorney, Agent, or Firm*—Lisa K. Jorgenson; Ronald Stern; Seed IP Law Group PLLC

(57) ABSTRACT

A device for protecting an electronic circuit comprising a support to which are attached at least two circuit portions, each comprising at least one integrated circuit chip. The device comprises a wafer of a semiconductor material covered with a conductive layer arranged parallel to the support, the wafer being connected to the support by conductive pillars distributed around each circuit portion and in contact with the conductive layer.

19 Claims, 2 Drawing Sheets

ELECTRONIC CIRCUIT PROTECTION DEVICE

BACKGROUND OF THE INVENTION

1. Field of the Invention

The present invention relates to a device for protecting an electronic circuit and a method for forming such a device.

2. Description of the Related Art

Many electronic circuits, for example, for cell phones, are formed by attaching to a main support, generally called a motherboard, elementary electronic circuits formed separately and each fulfilling a specific function. As an example, for a cell phone, an elementary electronic circuit corresponds to a radio transceiver circuit, intended to be connected to the cell phone antenna, and which demodulates the signals received at the antenna level and modulates the signals to be transmitted. Another elementary electronic circuit corresponds to a power amplifier circuit and enables amplification of the signals to be transmitted provided by the radio transceiver circuit. Each elementary electronic circuit is formed on a distinct support, for example, a ball grid array (BGA) or a land grid array (LGA).

Certain elementary electronic circuits may be sensitive to electromagnetic disturbances. Such is the case, for example, for the radio transceiver circuit of a cell phone which is generally attached to the motherboard, like the power amplifier circuit, close to the antenna. In particular, the proper operation of the radio transceiver circuit may be disturbed by electromagnetic disturbances transmitted by the power amplifier circuit.

FIG. 1 shows a conventional example of protection of an elementary electronic circuit against electromagnetic disturbances. In FIG. 1, a portion of a motherboard 10 on which an elementary electronic circuit 12 is welded has been shown in cross-section view. As an example, elementary electronic circuit 12 is formed of a BGA package 14, welded to motherboard 10 via bumps 16. Elementary electronic circuit 12 comprises an integrated circuit 18, attached to package 14 by a glue layer 20. Electric leads 22, for example, made of gold, ensure an electric connection between chip 18 and BGA package 14. A resin block 24 covers integrated circuit 18 and protects it against mechanical shocks.

To protect integrated circuit 18 against electromagnetic disturbances, a metal cover 26, welded to motherboard 10 and which encapsulates circuit 12, is provided. Cover 26 is grounded via motherboard 10. Generally, it is necessary to provide a metal cover, such as described in FIG. 1, for each elementary electronic circuit to be protected against electromagnetic disturbances.

The current tendency is to integrate on a same elementary electronic circuit, several functions, previously performed by separate elementary circuits. As an example, in mobile telephony, it may be desirable to form a single elementary electronic circuit which integrates the functions previously performed by the transceiver circuit and the power amplifier circuit. This may be obtained by arranging several integrated circuits on a same BGA or LGA package.

A difficulty then is to protect certain components of such an elementary electronic circuit against electromagnetic disturbances transmitted by other components of the same elementary electronic circuit. Indeed, the arranging of metal covers directly at the level of the elementary electronic circuit is generally incompatible with conventional methods for manufacturing such circuits.

BRIEF SUMMARY OF THE INVENTION

One embodiment of the present invention protects a portion of an electronic circuit, comprising at least one integrated circuit, against electromagnetic disturbances transmitted by another portion, comprising at least another integrated circuit, of the same electronic circuit and against electromagnetic disturbances transmitted by other electronic circuits.

Preferably, the protection method is compatible with current methods for manufacturing electronic circuits.

Preferably, the protection method only slightly modifies current electronic circuit manufacturing processes.

One embodiment of the present invention provides a device for protecting an electronic circuit comprising a support to which are attached at least two circuit portions, each comprising at least one integrated circuit chip. The device comprises a wafer of a semiconductor material covered with a conductive layer arranged parallel to the support, the wafer being connected to the support by conductive pillars distributed around each circuit portion and in contact with the conductive layer.

According to an embodiment of the present invention, several adjacent conductive pillars are spaced apart, the device further comprising an insulating region arranged at least between the wafer and the support and covering each circuit portion.

According to an embodiment of the present invention, the support comprises a planar insulating portion and means, contained in the planar portion, for connecting first conductive tracks arranged on a surface of the planar portion and second conductive tracks arranged on the opposite surface, several conductive pillars being in contact with conductive tracks, among the first conductive tracks, connected to conductive tracks, among the second conductive tracks, intended to be connected to a source of a reference voltage.

According to an embodiment of the present invention, the conductive pillars have a spherical shape.

According to an embodiment of the present invention, the conductive pillars have an at least partly cylindrical shape.

According to an embodiment of the present invention, at least two adjacent conductive pillars are in contact.

According to an embodiment of the present invention, the support is a ball grid array package.

One embodiment of the present invention is a method for manufacturing electronic circuits, comprising the steps of:

(a) providing a planar support;

(b) attaching on a surface of the support circuit portions, each containing at least one integrated circuit chip;

(c) attaching, parallel to said surface of the support, portions of a wafer of a semiconductor material, each wafer portion covering at least two adjacent circuit portions, being covered with a metal layer on the side of said at least two adjacent circuit portions and being connected to the support by conductive pillars distributed around each of said at least two adjacent circuit portions; and (d) delimiting electronic circuits, each comprising at least two adjacent circuit portions and the associated wafer portion.

According to an embodiment of the present invention, at least several adjacent conductive pillars are spaced apart and step (d) is preceded with a step of introducing an insulating material between the spaced apart adjacent conductive pillars under each wafer portion to cover said at least two adjacent circuit portions.

According to an embodiment of the present invention, the wafer portions are obtained by sawing of a wafer on which the conductive pillars are distributed.

The foregoing and other features, and advantages of the present invention will be discussed in detail in the following non-limiting description of specific embodiments in connection with the accompanying drawings.

DETAILED DESCRIPTION OF THE INVENTION

Figure 1:
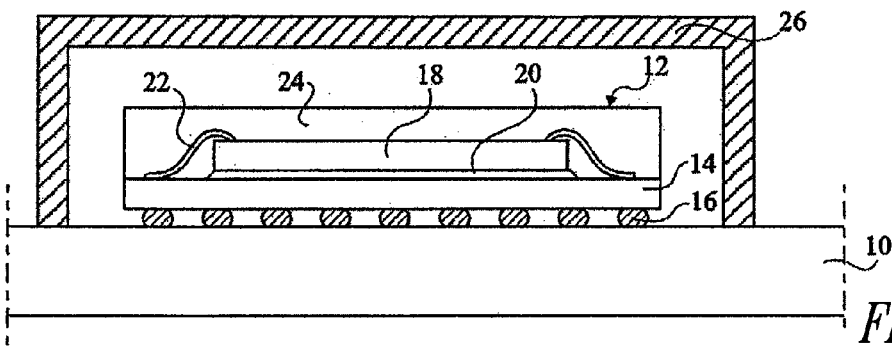
FIG. 1, previously described, shows a conventional device for protecting an electronic circuit, attached to a support, against electromagnetic disturbances.

For clarity, same elements have been designated with same reference numerals in the different drawings and, further, as usual in the representation of integrated circuits, the various drawings are not to scale.

FIGS. 2 to 8 illustrate successive steps of a first example of embodiment of a method according to the present invention for manufacturing an electronic circuit protected against electromagnetic disturbances.

Figure 2:
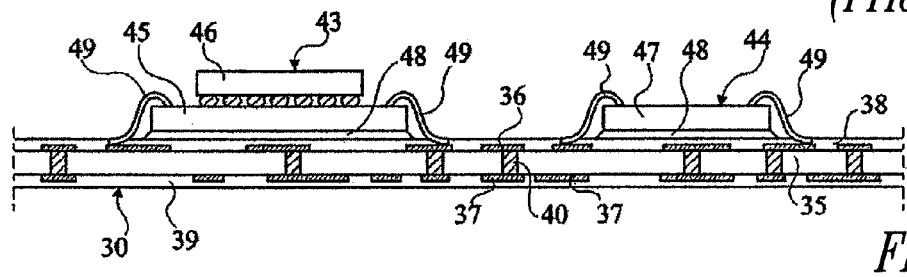
FIGS. 2 to 8 illustrate successive steps of an example of embodiment of a method according to the present invention for protecting an electronic circuit against electromagnetic disturbances.

FIG. 2 is a cross-section view of a support 30 from which BGA packages are obtained. Support 30 has the shape of a wafer and comprises a central layer 35 formed of an insulating material. Metal tracks 36, 37 are arranged on opposite surfaces of central layer 35 and are covered respectively with insulating layers 38, 39. Metal vias 40 are formed in central layer 35, each via 40 connecting a metal track 36 arranged on a surface of central layer 35 to a metal track 37 arranged on the opposite surface of central layer 35.

FIG. 2 shows the structure obtained after attachment of electronic circuits 43, 44 to support 30. In FIG. 2, the two shown circuits 43, 44 are intended, at the end of the manufacturing process, to be on a same portion of support 30. However, at the present step of the manufacturing method, circuits 43, 44 are reproduced many times on support 30. As an example, circuit 43 is a transceiver circuit formed of a first integrated circuit chip 45 and of a second integrated circuit chip 46 attached to the first integrated circuit chip 45 according to a flip/chip-type connection and circuit 44 is a power amplifier circuit formed of an integrated circuit chip 47. The attachment of circuits 43, 44 to support 30 is obtained by depositing glue portions 48 on support 30, by laying circuits 43, 44 at the level of glue portions 48, and by polymerizing glue portions 48. The electric connections between circuits 43, 44 and support 30 are obtained via electric wires 49, for example, made of gold, connected to metal tracks 36 through insulating layer 38. It should be clear that the structures of circuits 43, 44 are given as an illustration only, where circuits 43, 44 may comprise a greater or smaller number of integrated circuit chips.

Figure 3:
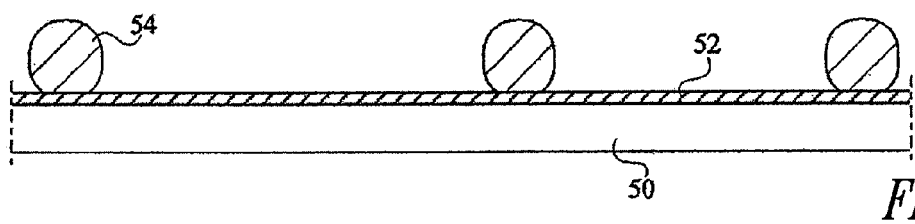
Figure 4:
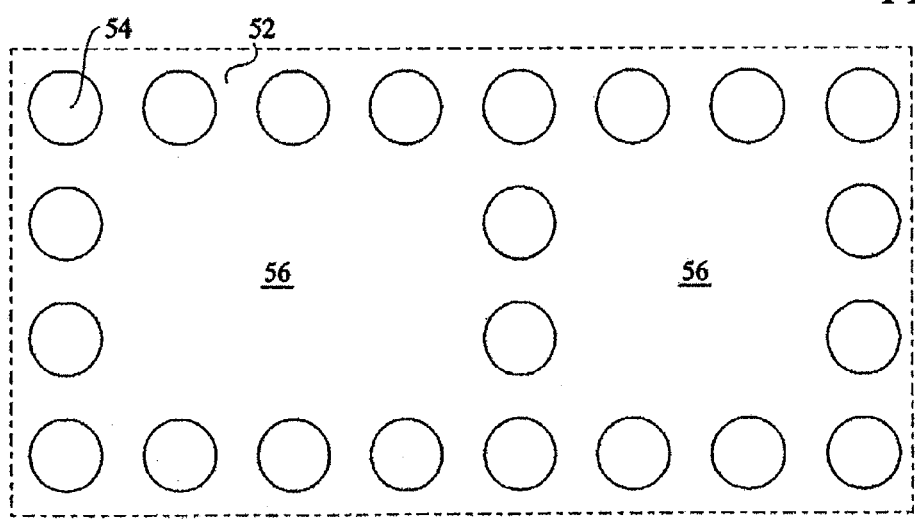

FIGS. 3 and 4 respectively are a cross-section view and a top view of a polysilicon wafer 50 on which a metal layer 52, for example, made of gold, aluminum, or silver, has been formed. As an example, the thickness of wafer 50 is on the order of 150 µm and the thickness of metal layer 52 is on the order of from 1 to 5 µm. Bumps 54, for example, made of tin, are distributed on metal layer 52. Bumps 54 may be formed by spreading welding paste on metal layer 52 through a mask to form welding paste pads, and by then melting the welding paste pads to give them a substantially spherical shape. To ease the positioning and the forming of bumps 54, metal layer 52 may be covered with an insulating layer, not shown, in which are formed openings at the level of the desired positions of bumps 54 to ease their forming. According to an alternative embodiment of the present invention, bumps 54 are replaced with pillar bumps having a substantially cylindrical shape, which may be formed of a cylindrical copper pad comprising a rounded tin end.

In top view, bumps 54 are distributed across wafer 50 according to a grid which delimits locations 56. As an example, bumps 54 have a diameter on the order of 800 µm. Bumps 54 may be separated, the distance separating two adjacent bumps 54 especially depending on the nature of the electromagnetic disturbances against which protection is desired. According to an alternative embodiment of the present invention, bumps 54 may be contiguous. According to another alternative embodiment of the present invention, some adjacent bumps 54 are at least partially in contact, while other adjacent bumps are separate.

Figure 5:
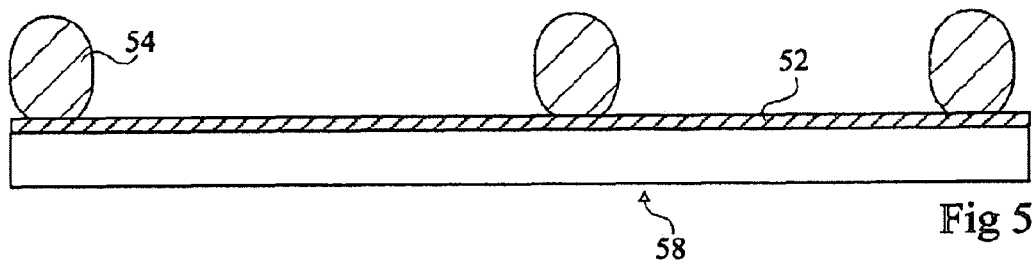

FIG. 5 is a cross-section view of the structure obtained after having sawn wafer 50 to form wafer portions 58, a single wafer portion 58 being shown in FIG. 5.

Figure 6:
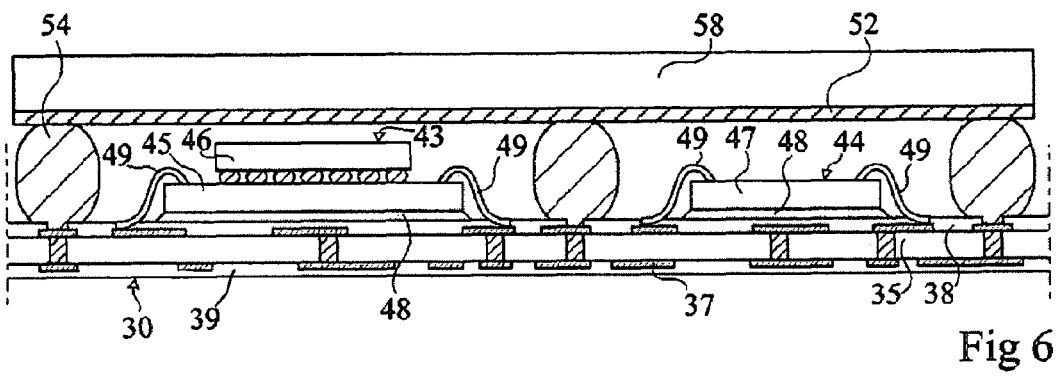

FIG. 6 is a cross-section view of the structure obtained after having attached to support 30 wafer portions 58 delimited at the preceding step, only one wafer portion 58 being shown in FIG. 5. Each wafer portion 58 may be attached to support 30 according to a flip-chip connection by properly orienting wafer portion 58 so that metal layer 52 faces support 30, circuits 43, 44 being above locations 56, and melting bumps 54 to attach wafer portion 58 to support 30. Openings are provided at the level of insulating layer 38 to expose metal portions 36 so that, for each wafer portion 58, bumps 54, or at least some of them, are in contact with the exposed metal tracks 36. Each circuit 43, 44 is then surrounded with bumps 54 and is above a portion of metal layer 52.

Figure 7:
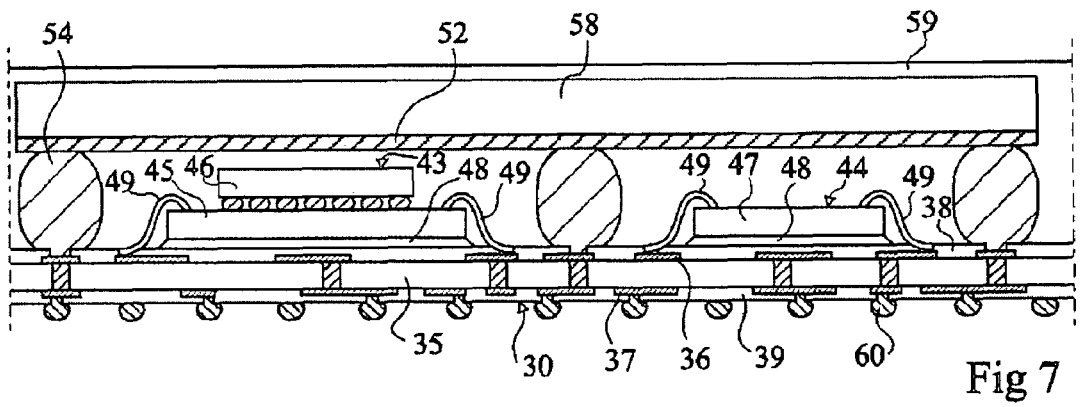

FIG. 7 shows the structure obtained after arrangement of an insulating material 59, for example, an epoxy resin and after having formed bumps 60, for example, tin, on the surface of support 30 opposite to circuits 43, 44. Some bumps 60 are connected to metal tracks 37 of support 30, through resin layer 39, enabling forming electric connections between bumps 60 and electric wires 49 and between bumps 60 and bumps 54. Insulating material 59 penetrates under wafer portion 58 and covers each circuit 43, 44. The interval between bumps 54 and the interval between circuits 43, 44 and wafer portion 58 must then be sufficient to enable a good penetration of the resin under wafer portion 58.

Figure 8:
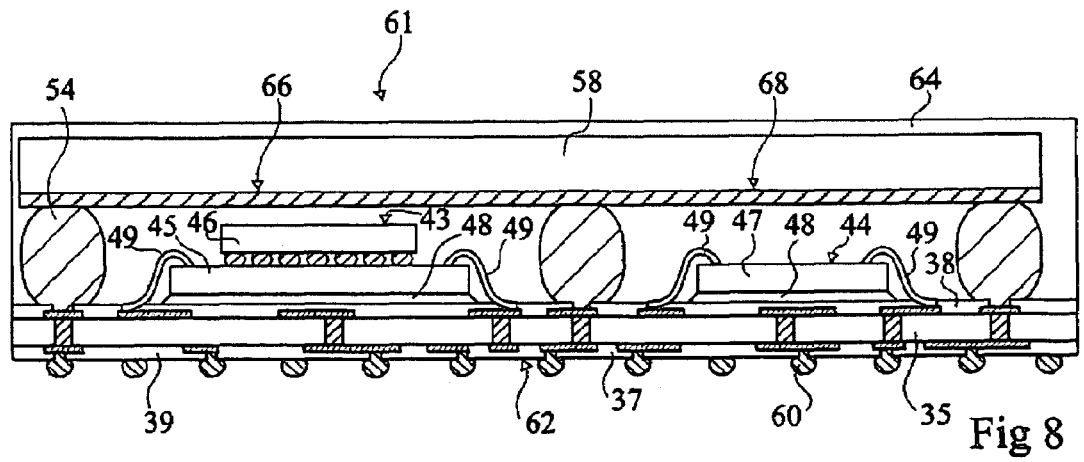

FIG. 8 shows the structure obtained after having sawn support 30 and insulating material 59 to define distinct electronic circuits 61, a single circuit 61 being shown in FIG. 8. Each electronic circuit 61 is formed, in the present example, of a portion 62 of support 30, forming a BGA package, to which are attached circuits 43 and 44, of wafer portion 58 covering circuits 43, 44, and of a resin block 64 surrounding wafer portion 58 and covering circuits 43, 44. The sawing of circuits 61 may be performed by means of a circular saw having a thickness that may be on the order of 100 micrometers. The dimensions of wafer portion 58 are advantageously smaller than the dimensions of the corresponding support portion 62 so that wafer portion 58 is not sawn as circuits 61 are delimited.

According to a variation of the present invention, the step in which insulating material 59 is arranged is not present. In this case, bumps 54 may be contiguous. It is then necessary for wafer portion 58 to have a sufficient thickness, for example, on the order of 300 μm, to ensure a sufficient mechanical protection of electronic circuits 43, 44 that it covers, which protection is otherwise partly ensured by resin block 64. Further, in this case, wafer portion 58 may come into contact with circuits 43, 44 or with one of them.

Electronic circuit 61 is, for example, intended to be attached to a motherboard. Bumps 54 and metal layer 52 may then be grounded via metal tracks 36 connected to bumps 54, and themselves connected to metal tracks 37 connected to bumps 60 which are, in turn, grounded via the motherboard. For each circuit 43, 44, the assembly formed by bumps 54 surrounding circuit 43, 44 and the portion of metal layer 52 opposite to circuit 43, 44 forms a metal cage 66, 68, which protects the circuit 43, 44 that it contains against external electromagnetic disturbances, especially electromagnetic disturbances transmitted by the other circuit 43, 44 attached to the same portion 62 of support 30.

Since the protection of circuits 43, 44 performed on the same portion 62 of support 30 is obtained by the corresponding metal cages 66, 68, it is then no longer necessary, when portion 62 of the support is subsequently attached to a motherboard, to provide a metal cover encapsulating support portion 62 which would anyway not protect each circuit 43, 44 against electromagnetic disturbances transmitted by the other circuit 43, 44 attached to the same support portion 62. For a circuit 61 of given dimensions, the provision of the protection device described above results in a smaller bulk than that resulting from the use of a metal cover. Indeed, the bulk of the protection device described above results from the addition of wafer portion 58, the thickness of which generally is on the order of 150 μm, to which adds the distance separating wafer portion 58 of circuits 43, 44 present when resin is injected under wafer portion 58, and which is on the order of 150 μm. When a distinct metal cover is used, it is necessary to provide an unoccupied region above circuit 61, generally greater than 1 mm to enable arrangement of the metal cover.

Further, the present invention enables proper setting of metal layer 52 and of bumps 54 to the motherboard ground. Indeed, some or even all of bumps 54 may be directly grounded via conductive tracks 36, enabling proper distribution of the voltages.

The present invention provides an electronic circuit protection circuit which, advantageously, results in few modifications with respect to a conventional electronic circuit manufacturing method. Indeed, the steps of forming wafer portions 58 implement conventional techniques of electronic circuit manufacturing methods.

Of course, the present invention is likely to have various alterations, modifications, and improvements which will readily occur to those skilled in the art. In particular, the present invention has been described for the protection of electronic circuits formed on a same BGA package. However, the present invention also relates to the protection of electronic circuits formed on a same LGA package and, more generally, to the protection of electronic circuits formed on a same support.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A device, comprising:
   an electronic circuit that includes a support to which are attached at least two circuit portions, each including at least one integrated circuit chip;
   a wafer of a semiconductor material spaced apart from the support;
   a conductive layer arranged parallel to the support and covering a surface of the wafer that faces the support; and
   conductive pillars connecting the wafer to the support and extending from the conductive layer to the support, the conductive pillars being distributed around each circuit portion and in contact with the conductive layer.

2. The device of claim 1, wherein several adjacent conductive pillars are spaced apart, the device further comprising an insulating region arranged at least between the wafer and the support and covering each circuit portion.

3. The device of claim 1, wherein the support comprises:
   a planar insulating portion;
   first conductive tracks arranged on a first surface of the planar insulating portion, the first conductive tracks being connected to at least some of the conductive pillars;
   second conductive tracks arranged on a second surface of the planar insulating portion opposite to the first surface, the second conductive tracks being for connection to a reference voltage; and
   means, contained in the planar insulating portion, for connecting the first conductive tracks to the second conductive tracks.

4. The device of claim 1, wherein the conductive pillars have a spherical shape.

5. The device of claim 1, wherein the conductive pillars have an at least partly cylindrical shape.

6. The device of claim 1, wherein at least two adjacent conductive pillars are in contact.

7. The device of claim 1, wherein the support is a ball grid array package.

8. A method for manufacturing electronic circuits, comprising the steps of:
   providing a planar support;
   attaching circuit portions on a surface of the support, each circuit portion containing at least one integrated circuit chip; and
   attaching wafer portions of a semiconductor material to the support, the wafer portions being spaced apart from and parallel to said surface of the support, each wafer portion: covering a respective one of the circuit portions, having a side facing the circuit portions being covered with a conductive layer, and being connected to the support by conductive pillars distributed around each of said circuit portions and extending between the conductive layer and the support.

9. The method of claim 8, wherein at least several adjacent conductive pillars are spaced apart and the delimiting step is preceded by introducing an insulating material between spaced apart portions of the conductive pillars and under each wafer portion to cover said at least two adjacent circuit portions.

10. The method of claim 8, wherein the wafer portions are obtained by sawing of a wafer on which the conductive pillars are distributed.

11. The method of claim 8 wherein the conductive pillars are formed by spreading welding paste through a mask on to the conductive layer.

12. The method of claim 8 wherein the conductive pillars are formed by forming an insulating layer on the conductive layer, etching the insulating layer to form openings, and forming the conductive pillars in the openings.

13. A protected electronic device, comprising:
a support;
first and second circuit portions positioned on the support, each circuit portion including at least one integrated circuit chip;
a wafer spaced apart from the support;
a conductive layer arranged parallel to the support and covering a surface of the wafer that faces the support; and
conductive pillars connecting the wafer to the support and extending from the conductive layer to the support, the conductive pillars being distributed around each circuit portion and in contact with the conductive layer,
wherein the wafer is of a semiconductor material.

14. The device of claim 13, wherein several adjacent conductive pillars are spaced apart, the device further comprising an insulating region arranged at least between the wafer and the support and covering each circuit portion.

15. The device of claim 13, wherein the support comprises:
a planar insulating portion;
first conductive tracks arranged on a first surface of the planar insulating portion, the first conductive tracks being connected to at least some of the conductive pillars;
second conductive tracks arranged on a second surface of the planar insulating portion opposite to the first surface, the second conductive tracks being for connection to a reference voltage; and
conductive vias extending through the planar insulating portion and connecting the first conductive tracks to the second conductive tracks.

16. The device of claim 13, wherein the conductive pillars have a spherical shape.

17. The device of claim 13, wherein the conductive pillars have an at least partly cylindrical shape.

18. The device of claim 13, wherein at least two adjacent conductive pillars are in contact.

19. The device of claim 13, wherein the conductive pillars are distributed around four sides of each of the circuit portions.

* * * * *